United States Patent [19]

Tietz et al.

[11] 4,122,405
[45] Oct. 24, 1978

[54] DIGITAL LOGIC LEVEL SIGNAL INDICATION OF PHASE AND FREQUENCY LOCK CONDITION IN A PHASE-LOCKED LOOP

[75] Inventors: Gary William Tietz; Keith James Mueller, both of San Jose, Calif.

[73] Assignee: National Semiconductor Corporation, Santa Clara, Calif.

[21] Appl. No.: 844,409

[22] Filed: Oct. 21, 1977

[51] Int. Cl.$^2$ .......................... H03D 3/04; H03K 5/20
[52] U.S. Cl. .................................... 331/1 A; 307/232; 328/133; 331/25; 331/64
[58] Field of Search .......................... 331/1 A, 25, 64; 328/133, 134; 307/232; 324/83 R, 83 D, 83 Q

[56] References Cited

U.S. PATENT DOCUMENTS 3,982,190   9/1976   Schaefer ........................ 331/25 X

OTHER PUBLICATIONS

Hill, "Out of Lock Detector for Automatic Phase Control," Electronic Design, Nov. 8, 1965, pp. 53–54.
Leck, "Logic Gates and LED Indicate Phase Lock," Electronics, vol. 48, No. 11, May 29, 1975, p. 106.

Primary Examiner—Siegfried H. Grimm
Attorney, Agent, or Firm—Brown & Martin

[57] ABSTRACT

A digital logic level signal indicates whether a first signal in a phase-locked loop is locked in phase and frequency with a second signal provided to the loop. The digital logic level signal is provided from the sequentially last stage of a counter having a predetermined number of stages. The counter counts cycles in an input signal corresponding to one of the first signal and the second signal. A reset signal pulse having a first predetermined duration is provided to the counter from a pulse width discriminator when the pulse width discriminator detects a phase difference between the first and second signals of greater than a second predetermined duration. The reset signal pulse resets the counter. The digital logic level signal is in a state indicating an in-lock condition when a predetermined number of input signal cycles occur without the counter being reset.

4 Claims, 1 Drawing Figure

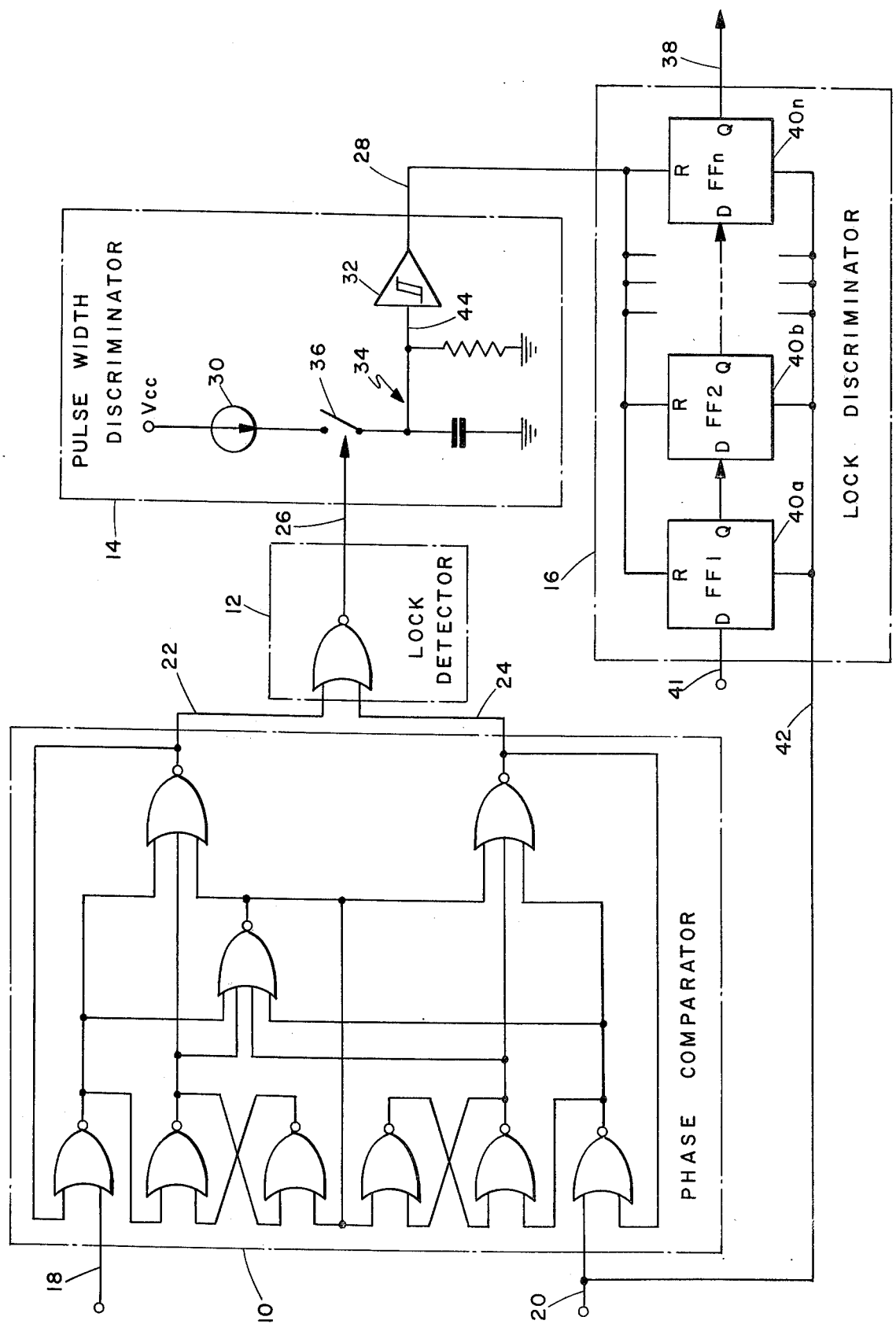

DIGITAL LOGIC LEVEL SIGNAL INDICATION OF PHASE AND FREQUENCY LOCK CONDITION IN A PHASE-LOCKED LOOP

BACKGROUND OF THE INVENTION

The present invention is directed to providing logic level signal indication of whether a first signal in a phase-locked loop is locked in phase and frequency to a second signal provided to the loop.

In prior art systems, a phase comparator is coupled to the phaselocked loop for providing a first correction signal when the first and second signals are out of phase in one direction and a second correction signal when the first and second signals are out of phase in the opposite direction; and a lock detector is coupled to the phase comparator for providing a first digital logic signal having a first state whenever either the first correction signal or the second correction signal is provided from the phase comparator, and a second state when neither correction signal is provided. The second state thereby indicates that the first signal is locked in phase to the second signal.

The problem with these prior art systems is that every single correction signal pulse produces an equal duration pulse at the lock detector output. Since there are always correction signal pulses occuring in a phase-locked loop system, the lock detector output is constantly pulsing. This output can be integrated, but then an analog signal is produced (as opposed to a digital logic level signal) for indicating whether the loop is in or out of lock. In addition, with an analog signal the pulse width that can be discriminated as indicating an "out of lock" condition is excessively wide.

SUMMARY OF THE INVENTION

The present invention is a system for providing a digital logic level signal that indicates whether a first signal in a phase-locked loop is locked in phase and frequency to a second signal provided to the loop. The system of the present invention includes a phase comparator and a lock detector which function in the same manner as the like devices in the prior art systems discussed hereinabove.

The system of the present invention is characterized by a pulse width discriminator coupled to the lock detector for providing a reset signal pulse having a first predetermined duration when the digital logic level signal from the lock detector is in its first state for at least a second predetermined duration; and a lack discriminator coupled to the pulse width discriminator and responsive to one of the first signal and the second signal as an input signal for providing a second digital logic level signal that indicates that the loop is in lock when a predetermined number of input signal cycles occur without the reset signal pulse being provided by the pulse width discriminator.

Preferably, the pulse width discriminator includes a current source; a Schmitt trigger circuit; an integrator coupled to the input of the Schmitt trigger circuit; and a switch coupled between the current source and the input of the Schmitt trigger circuit and coupled to the lock detector. When the first digital logic level signal is in its first state, the switch connects the current source to the input of the Schmitt trigger circuit and the integrator. The integrator causes the Schmitt trigger circuit to provide the reset signal pulse only when current is provided from the current source for at least the second predetermined duration.

Preferably the lack discriminator includes a counter having a predetermined number of stages corresponsing to the predetermined number of input signal cycles to be counted. The sequentially last stage provides the second digital logic level signal. Each stage is clocked by the input signal; and each stage is reset in response to the reset signal pulse.

BRIEF DESCRIPTION OF THE DRAWING

The FIGURE of the drawing is a schematic diagram of the system of the present invention.

DESCRIPTION OF THE PREFERRED EMBODIMENT

The system of the present invention includes a phase comparator 10, a lock detector 12, a pulse width discriminator 14 and a lock discriminator 16.

The phase comparator 10 compares the phase of a first signal on line 18 with the phase of a second signal on line 20; and provides first and second correction signals on lines 22 and 24 respectively.

The phase comparator 10 is coupled to a phase-locked loop via lines 18, 20, 22 and 24 for providing a first correction signal on line 22 when the first and second signals on lines 18 and 20 are out of phase in one direction, and a second correction signal on line 24 when the first and second signals on lines 18 and 20 are out of phase in the opposite direction.

The lock detector 12 is coupled to the phase comparator 10 for providing a first digital logic level signal on line 26. The first digital logic level signal has a first state whenever either the first correction signal is provided on line 22 or the second correction signal is provided on line 24. The first digital logic level signal on line 26 has a second state whenever neither the first correction signal is provided on line 22 nor the second correction signal is provided on line 24. Accordingly, the first digital logic level signal on line 26 is in its second state when the first signal on line 18 is locked in phase to the second signal on line 20.

The pulse width discriminator 14 provides a reset signal pulse having a first predetermined duration on line 28 when the first digital logic level signal on line 26 from the lock detector 12 is in its first state for at least a second predetermined duration. The reset signal pulse on line 28 has a first predetermined duration greater than that which is required to reset the lack discriminator 16.

The pulse width discriminator 14 includes a current source 30; a Schmitt trigger circuit 32; an RC integrator circuit 34 coupled to the input of the Schmitt trigger circuit 32; and a switch 36. The switch 36 is coupled between the current source 30 and the input of the Schmitt trigger circuit 32, and is coupled to the lock detector 12. When the first digital logic level signal on line 26 is in its first state the switch 36 responds by connecting the current source 30 to the input of the Schmitt trigger circuit 32 and to the integrator circuit 34.

The integrator circuit 34 includes a resistance R and a capacitance C connected in parallel therewith across the input of the Schmitt trigger circuit 32. The integrator circuit 34 causes the Schmitt trigger circuit 32 to provide the reset signal pulse on line 28 only when current is provided to the Schmitt trigger circuit 32 from the current source 30 for at least the given second predetermined duration.

The lack discriminator 16 is coupled to the pulse width discriminator 14 and responds to the second signal on line 20 as an input signal to provide a second digital logic level signal on line 38. The second digital logic level signal on line 38 indicates that the loop is in lock when a predetermined number of input signal cycles occur without the reset signal pulse being provided on line 28 by the pulse width discriminator 14.

The lack discriminator 16 includes a counter having a number of stages 40a, 40b . . . 40n corresponding to the predetermined number of input signal cycles to be counted. The second digital logic level signal is provided on line 38 from the sequentially last stage 40n. Each stage 40a, 40b . . . 40n is a D flip-flop. A high level logic signal is provided on line 41 to the D input of the first stage flip-flop 40a. Each stage 40a, 40b . . . 40c is clocked by the input signal on line 42 from line 20 and is reset in response to the reset signal pulse on line 28.

In the pulse width discriminator 14, the values of I, R, and C are determined by two considerations: (1) the maximum phase error to be allowed between the first and second signals on lines 18 and 20 under conditions where in the first and second signals can still be considered as being "in-lock", as measured by the pulse width $PW_1$ of the first logic level signal on line 26 from the lock detector 12; and (2) the pulse width $PW_2$ of the reset signal pulse on line 28 provided from the Schmitt trigger circuit 32 that is necessary to reset the counter of the lock discriminator 16.

Using the Schmitt trigger circuit 32 to sense the integrated voltage on line 44 provides the capability of detecting a very small phase error between the first and second signals on lines 18 and 20, while still providing a sufficiently long output pulse $PW_2$ to reset the counter. The equations for calculating I, R, and C based upon the desired pulse widths $PW_1$ and $PW_2$ and the given thresholds of the Schmitt trigger, ($V_{TH}$ = high threshold, $V_{TL}$ = low threshold) are:

$$PW_1 = RC \ln \left( \frac{IR}{IR - V_{TH}} \right) \quad (1)$$

$$PW_2 = +RC \ln \frac{V_{TH}}{V_{TL}} \quad (2)$$

$$IR > V_{TH} \quad (3)$$

The absence of a reset signal pulse on line 28 from the pulse width discriminator 14 indicates, during any given cycle, that the signals on lines 18 and 20 are in phase within the error allowed by the predetermined pulse width $PW_1$.

As the system searches for an "in-lock" condition, momentary "in-phase" conditions will occur. The lock discriminator 16 prevents these random occurrences from causing an "in-lock" condition to be indicated by the second digital logic level signal on line 38; as well as preventing a "lock" from being indicated at some multiple of the frequency of the signal on line 20. The lock discriminator 16 counts "n" successive "in-lock" cycles prior to providing an "in-lock" on line 38.

Accordingly, a correction signal on either line 22 or 24 that is greater in duration than $PW_1$ will cause the counter of the lock discriminator 16 to be reset, and the second logic level signal on line 38 will assume a state indicating an "in-lock" condition only after "n" successive input signal cycles during which the phase error is less than that corresponding to $PW_1$.

We claim:

1. A system for providing a digital logic level signal that indicates whether a first signal in a phase-locked loop is locked in phase and frequency to a second signal provided to the loop, comprising:

a phase comparator coupled to the phase locked loop for providing a first correction signal when the first and second signals are out of phase in one direction, and a second correction signal when the first and second signals are out of phase in the opposite direction;

a lock detector coupled to the phase comparator for providing a first digital logic level signal having a first state whenever either the first correction signal or the second correction signal is provided from the phase comparator, and having a second state whenever neither the first correction signal nor the second correction signal is provided from the phase comparator, the second state thereby indicating that the first signal is locked in phase to the second signal;

a pulse width discriminator coupled to the lock detector for providing a reset signal pulse having a first predetermined duration when the digital logic level signal from the lock detector is in said first state for at least a second predetermined duration; and a lock discriminator coupled to the pulse width discriminator and responsive to one of the first signal and the second signal as an input signal for providing a second digital logic level signal that indicates that the loop is in lock when a predetermined number of input signal cycles occur without said reset signal pulse being provided by the pulse width discriminator.

2. A system according to claim 1, wherein the pulse width discriminator comprises:

a current source;

a Schmitt trigger circuit;

an integrator coupled to the input of the Schmitt trigger circuit; and a switch coupled between the current source and the input of the Schmitt trigger circuit and coupled to the lock detector, said switch being responsive to the first digital logic level signal being in its first state for connecting the current source to the input of the Schmitt trigger circuit and the integrator, wherein the integrator causes the Schmitt trigger circuit to provide said reset signal pulse only when current is provided from the current source for at least said second predetermined duration.

3. A system according to claim 2, wherein the lock discriminator comprises:

a counter having a predetermined number of stages corresponding to the predetermined number of input signal cycles to be counted, including a sequentially last stage for providing the second digital logic level signal, wherein each stage is clocked by the input signal and each stage is reset in response to the reset signal pulse.

4. A system according to claim 1, wherein the lock discriminator comprises:

a counter having a predetermined number of stages corresponding to the predetermined number of input signal cycles to be counted, including a sequentially last stage for providing the second digital logic level signal, wherein each stage is clocked by the input signal and each stage is reset in response to the reset signal pulse.

* * * * *